United States Patent
Yasotharan et al.

(10) Patent No.: US 10,200,025 B2
(45) Date of Patent: Feb. 5, 2019

(54) PULSE-AMPLITUDE MODULATED HYBRID COMPARATOR CIRCUIT

(71) Applicant: Intel Corporation, Santa Clara, CA (US)

(72) Inventors: Hemesh Yasotharan, Toronto (CA); Raymond K Tang, Markham (CA); James Guthrie, Burlington (CA)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/391,584

(22) Filed: Dec. 27, 2016

(65) Prior Publication Data

US 2018/0183422 A1  Jun. 28, 2018

(51) Int. Cl.
| | |
|---|---|
| *H03K 19/094* | (2006.01) |
| *H03F 3/45* | (2006.01) |
| *H03K 5/24* | (2006.01) |
| *H03K 3/356* | (2006.01) |
| *H03K 7/02* | (2006.01) |
| *G06F 13/42* | (2006.01) |
| *G11C 7/10* | (2006.01) |

(52) U.S. Cl.
CPC ........... *H03K 5/249* (2013.01); *G06F 1/3287* (2013.01); *G06F 1/3296* (2013.01); *G06F 13/4282* (2013.01); *G11C 7/106* (2013.01); *G11C 7/1057* (2013.01); *G11C 7/1084* (2013.01); *G11C 7/1087* (2013.01); *H03K 3/356139* (2013.01); *H03K 3/356191* (2013.01); *H03K 7/02* (2013.01); *G06F 1/324* (2013.01); *G06F 2213/0026* (2013.01)

(58) Field of Classification Search
CPC .... H03K 5/249; H03K 7/02; H03K 3/356139; G06F 1/3296; G06F 13/4282; G06F 1/3287; G06F 1/324; G06F 2213/0026; G11C 7/065
See application file for complete search history.

(56) References Cited

U.S. PATENT DOCUMENTS

| | | | |
|---|---|---|---|
| 5,606,270 A * | 2/1997 | D'Souza | H03K 19/0016 326/121 |
| 5,731,776 A * | 3/1998 | Kumamoto | H03M 1/362 341/155 |
| 6,452,529 B1 * | 9/2002 | Li | H03M 1/141 341/155 |
| 6,518,898 B1 * | 2/2003 | Choksi | H03M 1/1004 341/118 |
| 6,762,957 B2 * | 7/2004 | Hsu | H03K 3/012 326/80 |

(Continued)

*Primary Examiner* — Kenneth B Wells
(74) *Attorney, Agent, or Firm* — Schwegman Lundberg & Woessner, P.A.

(57) ABSTRACT

Some embodiments include apparatus and methods using a first latch to receive an input signal at a gate of a transistor of the first latch and compare the input signal with a reference signal to provide a first output signal at an output node of the first latch, and a second latch coupled to the output node of the first latch, the second latch including a complementary metal-oxide semiconductor (CMOS) inverter to generate a second output signal at an output node of the second latch based on the first output signal. The second output signal has a signal swing greater than a signal swing of the first output signal.

12 Claims, 7 Drawing Sheets

(56) References Cited

U.S. PATENT DOCUMENTS

| | | | | |
|---|---|---|---|---|
| 6,798,249 B2* | 9/2004 | Wong | H03K 3/356139 | |
| | | | 326/115 | |
| 7,202,706 B1* | 4/2007 | Plasterer | H03K 19/01707 | |
| | | | 326/115 | |
| 7,474,127 B2* | 1/2009 | Mohanavelu | H03K 19/018528 | |
| | | | 326/115 | |
| 7,560,957 B2* | 7/2009 | Chen | H03K 19/01707 | |
| | | | 326/112 | |
| 8,200,179 B1* | 6/2012 | Mosinskis | H03F 3/45183 | |
| | | | 375/233 | |
| 8,223,047 B2* | 7/2012 | Lai | H03M 1/1004 | |
| | | | 341/120 | |
| 8,330,632 B2* | 12/2012 | Bashirullah | H03M 1/1061 | |
| | | | 341/120 | |
| 9,806,918 B1* | 10/2017 | Su | H04L 25/03057 | |
| 9,860,087 B1* | 1/2018 | Francese | H04L 25/03057 | |

* cited by examiner

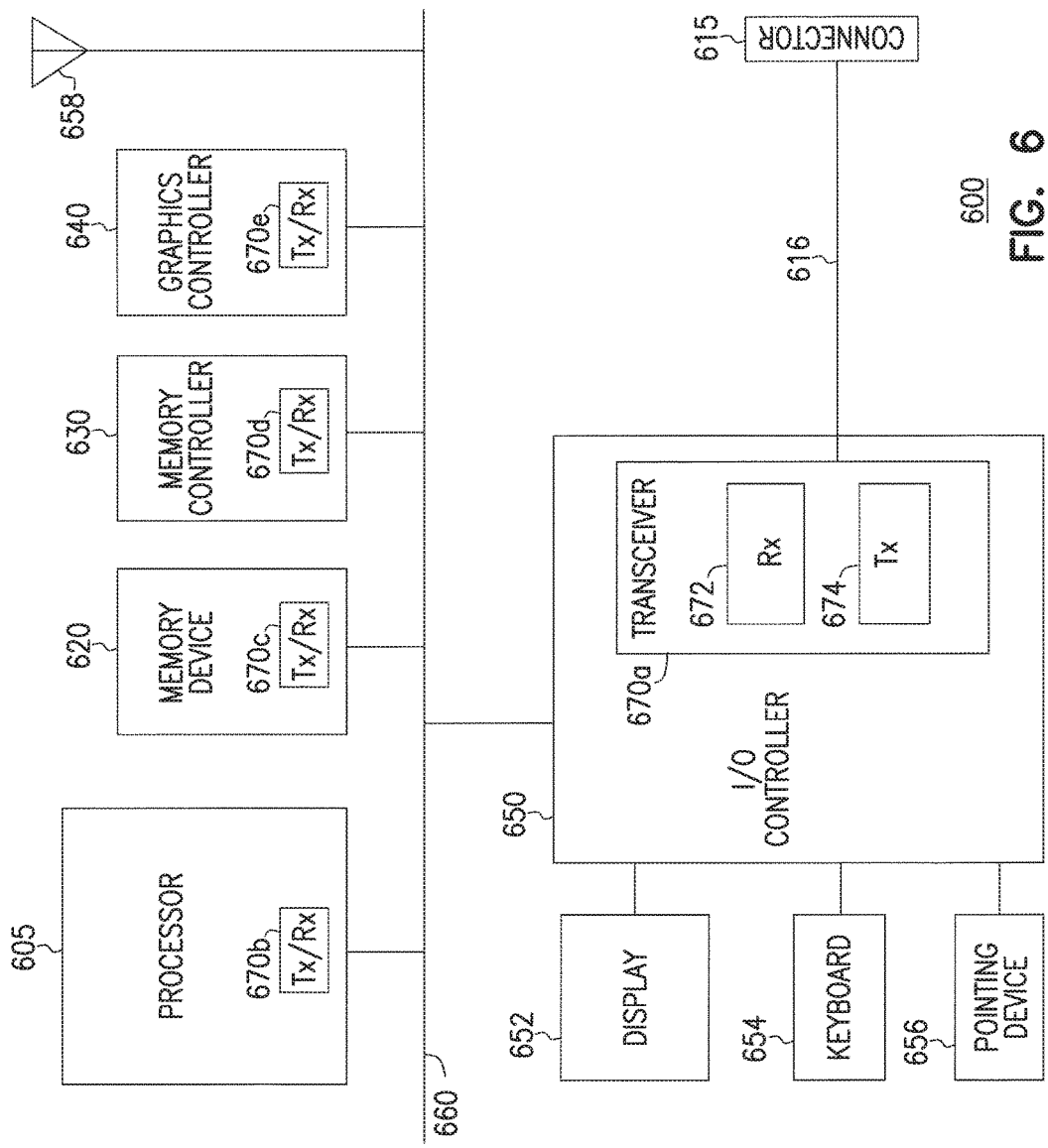

PULSE-AMPLITUDE MODULATED HYBRID COMPARATOR CIRCUIT

TECHNICAL FIELD

Embodiments described herein pertain to receivers in integrated circuits. Some embodiments relate to comparator circuits in such receivers.

BACKGROUND

Many electronic devices or systems, such as computers, tablets, and cellular phones, include receivers to receive signals. The signals carry information (e.g., data) transmitted from one device to another device. Some conventional receivers use current-mode-logic (CML)-type comparator circuits to receive input data signals. Some other conventional receivers use complementary metal-oxide semiconductor (CMOS)-type comparator circuits to receive input data signals. CML comparator circuits can operate at a relatively higher speed, but they usually consume a relatively higher amount of power. CMOS comparator circuits normally consume a relatively lower power, but they are typically slower than CML comparator circuits, especially when the input data signal is small. Thus, each type (CML-type or CMOS-type) of comparator circuit has its own drawbacks.

BRIEF DESCRIPTION OF THE DRAWINGS

FIG. 6 shows an apparatus in the form of an electronic system, according to some embodiments described herein.

DETAILED DESCRIPTION

The techniques described herein combine CML-type circuitry and CMOS-type circuitry into a single (e.g., hybrid) CML-CMOS comparator circuit. In an example, the comparator circuit described herein includes a combination of a pseudo-CML latch (e.g., a latch based on a CML-type latch) and a modified CMOS latch (e.g., a latch based on a CMOS-type latch). The pseudo-CML latch can operate as an input stage of the comparator circuit. The pseudo-CIVIL latch can be configured to detect different levels of a pulse-amplitude modulated (PAM) signal. The pseudo-CML latch can also include a programmable active inductor peaking structure to extend the bandwidth of the pseudo-CML latch. The modified CMOS latch can operate as an output stage of the comparator circuit. The modified CMOS latch can operate in a track mode to track a differential signal pair and a hold mode (e.g., latch mode) to convert the differential signal pair into CMOS output signals.

The described comparator circuit has the benefits of CML comparator circuits (e.g., higher speed and better input signal sensitivity) and the benefits of CMOS comparator circuits (e.g., lower power consumption and smaller size). These combined benefits allow the described comparator circuit to be suitable for use in receivers that operate at a relatively higher speed, consume a relatively lower amount of power, and receive input signals having small signal values (e.g., signals having small aperture openings). An example of such signal includes pulse-amplitude modulated (PAM) signals.

Figure 1:
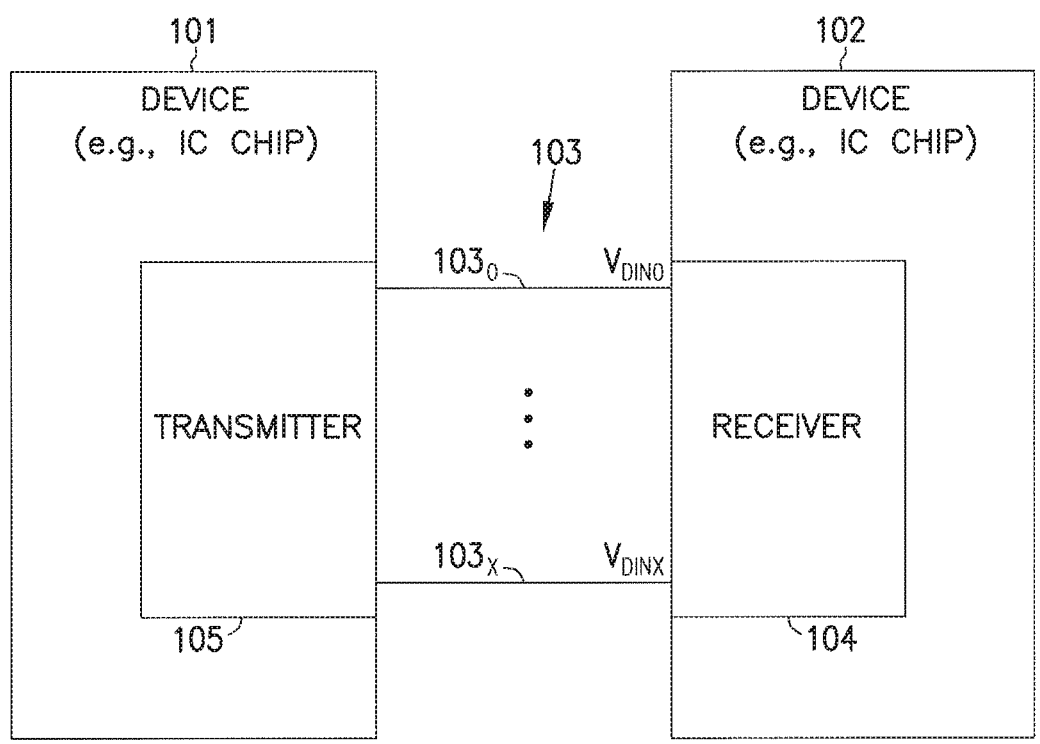
FIG. 1 shows an apparatus including devices and a channel between the devices, according to some embodiments described herein.

FIG. 1 shows an apparatus 100 including devices 101 and 102, and a channel 103 between devices 101 and 102, according to some embodiments described herein. Apparatus 100 can include or be included in an electronic device or system, such as a computer (e.g., server, desktop, laptop, or notebook), a tablet, a cellular phone, or other electronic devices or systems. Each of devices 101 and 102 can include an integrated circuit (IC), such as an IC chip. Devices 101 and 102 can include a combination of a controller (e.g., processors (e.g., central processing unit (CPU)), graphics controller, input/output controller, or memory controller), a memory device, and/or other electronic devices.

Device 101 can include a transmitter 105 (which can be part of a transceiver of device 101). Device 102 can include a receiver 104 (which can be part of a transceiver of device 102), respectively. Channel 103 can provide communication (e.g., in the form of signal transmission) between devices 101 and 102. Channel 103 can include lanes $103_0$ through $103_X$ to conduct signals between devices 101 and 102. Each of lanes $103_0$ through $103_X$ can be a bi-directional lane and can be used to carry a single-ended signal or alternatively a differential pair signal. Each of lanes $103_0$ through $103_X$ can include a single conductive trace (or alternatively multiple conductive traces), such as metal-based traces of a bus on a circuit board (e.g., printed circuit board of an electronic system) where devices 101 and 102 are located. In an alternative arrangement, channel 103 does not have to include conductive lines on a circuit board. For example, channel 103 can include a medium (e.g., air) for wireless communication between devices 101 and 102, or other types of medium (e.g., conductive paths within an IC package).

Devices 101 and 102 can communicate with each other by providing signals on lanes $103_0$ through $103_X$. As shown in FIG. 1, for example, transmitter 105 may transmit signals $V_{DIN0}$ through $V_{DINX}$ to receiver 104 through channel 103 (e.g., on lanes $103_0$ through $103_X$, respectively). Receiver 104 can include components and operations of the receivers described below with reference to FIG. 2 through FIG. 7.

Figure 2:
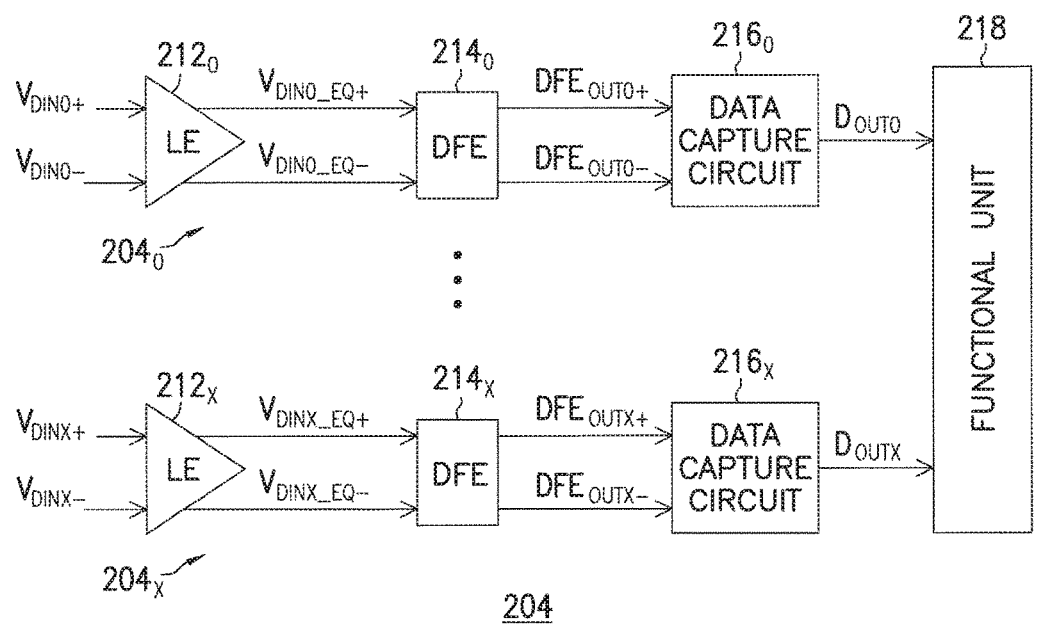
FIG. 2 shows a block diagram of a receiver including receiver lanes, according to some embodiments described herein.

FIG. 2 shows a block diagram of a receiver 204 including receiver lanes $204_0$ through $204_X$, according to some embodiments described herein. Receiver 204 can correspond to receiver 104 of FIG. 1. Each of receiver lanes $204_0$ through $204_X$ can perform an equalization operation on respective analog input signals to generate respective digital output information (e.g., bits of information).

For example, receiver lane $204_0$ can receive signals (e.g., analog input signals) $V_{DIN0+}$ and $V_{DIN0-}$ and generate information $D_{OUT0}$ (e.g., digital output information). Receiver lane $204_X$ can receive signals (e.g., analog input signals) $V_{DINX+}$ and $V_{DINX-}$ and generate information $D_{OUTX}$ (e.g., digital output information). Receiver 204 can include a functional unit 218 to further process information $D_{OUT0}$ and $D_{OUTX}$.

Signals $V_{DIN0+}$ and $V_{DIN0-}$ can form a differential signal pair. Signals $V_{DINX+}$ and $V_{DINX-}$ can form a differential signal pair. Signals $V_{DIN0+}$ and $V_{DIN0-}$ and $V_{DINX+}$ and $V_{DINX-}$ can be provided to receiver 204 by a transmitter, such as transmitter 105 of FIG. 1. FIG. 2 shows an example where receiver 204 includes two receiver lanes $204_0$ through $204_X$. The number of receiver lanes can vary.

As shown in FIG. 2, receiver lane $204_0$ can include a linear equalizer (LE) $212_0$ (which can include a continuous time linear equalizer (CTLE)), a DFE $214_0$, and a data capture circuit $216_0$. Linear equalizer $212_0$ can perform an equalization operation (e.g., a CTLE operation) to improve the quality of input signals $V_{DIN0+}$ and $V_{DIN0-}$ and generate signals (e.g., equalized signals) $V_{DIN0\_EQ+}$ and $V_{DIN0\_EQ-}$. Signals $V_{DIN0\_EQ+}$ and $V_{DIN0\_EQ-}$ can form a differential signal pair. DFE $214_0$ can perform an equalization operation (e.g., DFE operation) on signals $V_{DIN0\_EQ+}$ and $V_{DIN0\_EQ-}$ and generate information $D_{OUT0\_DFE+}$ and $D_{OUT0\_DFE-}$, which are DFE digital output information. Data capture circuit $216_0$ can operate to capture (e.g., to latch) information $D_{OUT0\_DFE+}$ and $D_{OUT0\_DFE-}$ and generate information $D_{OUT0}$.

In a similar arrangement, receiver lane $204_X$ can include LE $212_X$, DFE $214_X$, and a data capture circuit $216_X$. Similar to receiver lane $204_0$, receiver lane $204_X$ can operate to receive signals $V_{DINX+}$ and $V_{DINX-}$ and generate signals (e.g., equalized signals) $V_{DINX\_EQ+}$ and $V_{DINX\_EQ-}$, information $DFE_{OUT0+}$ and $DFE_{OUT0-}$, and information $D_{OUTX}$.

Receiver 204 can include components and operations of the receivers described below with reference to FIG. 3 through FIG. 7.

Figure 3:
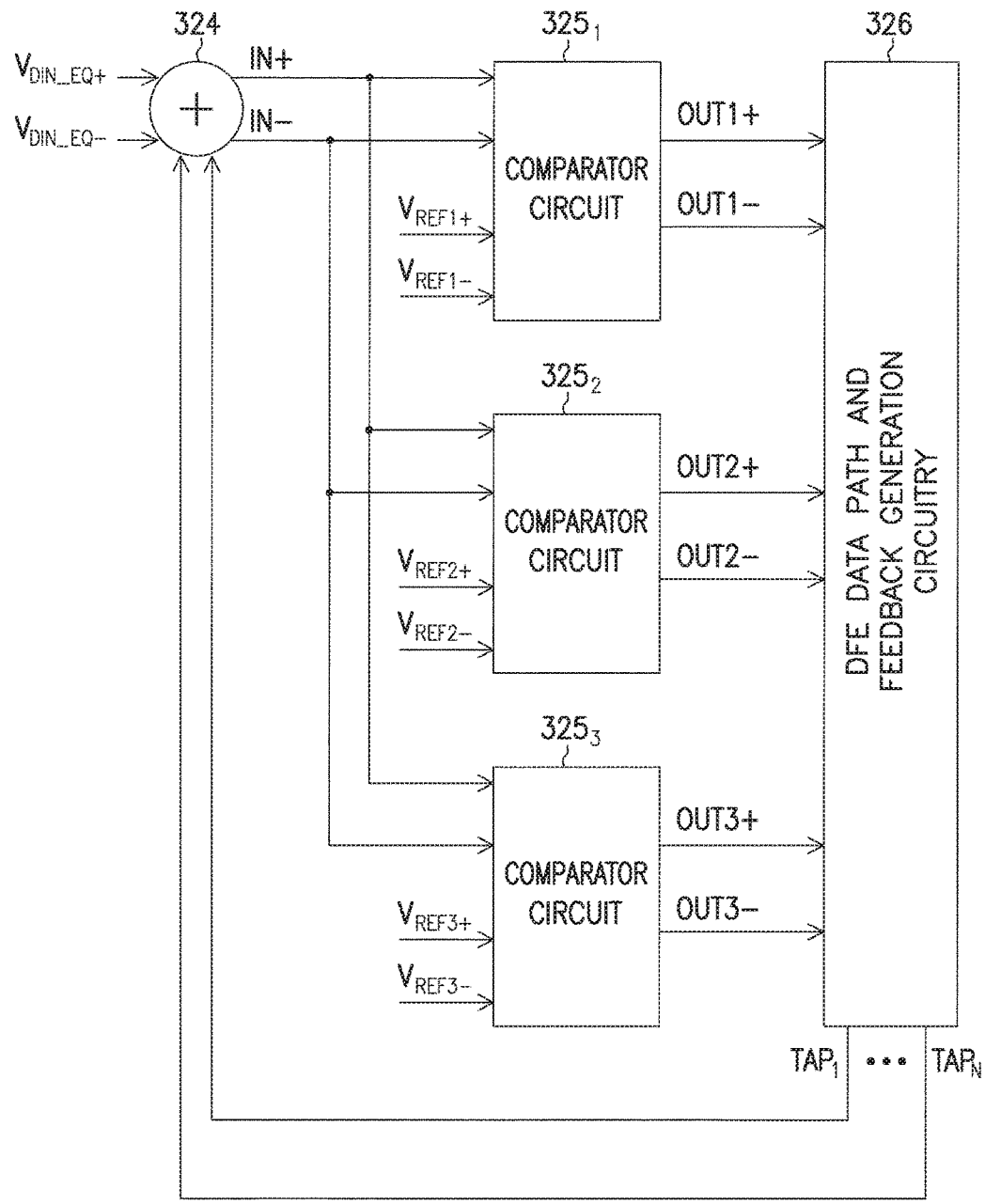
FIG. 3 shows a schematic diagram of a decision feedback equalizer (DFE) including multiple comparator circuits, according to some embodiments described herein.

FIG. 3 shows a schematic diagram of a DFE 314 including multiple comparator circuits $325_1$, $325_2$, and $325_3$, according to some embodiments described herein. DFE 314 can correspond to one of DFE $214_0$ through DFE $214_X$ of FIG. 2. As shown in FIG. 3, DFE 314 can include a summing node 324 to receive signals $V_{DIN\_EQ+}$ and $V_{DIN\_EQ-}$ (which can correspond to signals $V_{DIN0\_EQ+}$ and $V_{DIN0\_EQ-}$, respectively (FIG. 2) or signal $V_{DINX\_EQ+}$ and $V_{DINX\_EQ-}$, respectively, (FIG. 2)). Summing node 324 can provide signals IN+ and IN− based on signals $V_{DIN\_EQ+}$ and $V_{DIN\_EQ-}$. Signals IN+ and IN− can form a differential signal pair.

As shown in FIG. 3, comparator circuits $325_1$, $325_2$, and $325_3$, can receive the same signals IN+ and EN− at their respective input nodes. Comparator circuit $325_1$ can operate to compare the values of signals IN+ and IN− with the values of signals (e.g., reference signals) $V_{REF1+}$ and $V_{REF1-}$, respectively, and generate signals OUT1+ and OUT1− (which can form a differential signal pair). Comparator circuit $325_2$ can operate to compare the values of signals IN+ and IN− with the values of signals (e.g., reference signals) $V_{REF2+}$ and $V_{REF2-}$, respectively, and generate signals OUT2+ and OUT2− (which can form a differential signal pair). Comparator circuit $325_3$ can operate to compare the values of signals IN+ and IN− with the values of signals (e.g., reference signals) $V_{REF3+}$ and $V_{REF3-}$, respectively, and generate signals OUT3+ and OUT3−. Each of signal pair OUT1+ and OUT1−, OUT2+ and OUT2−, and OUT3+ and OUT3− can form a different differential signal pair.

As shown in FIG. 3, DFE 314 can include circuitry 326, which can include DFE data path and feedback generation circuitry. Circuitry 326 can operate to receive signals OUT1+ and OUT1−, OUT2+ and OUT2−, and OUT3+ and OUT3− from respective comparator circuits $325_1$, $325_2$, and $325_3$. Circuitry 326 can generate information $DFE_{OUT}$ and provide it to other components (not shown) of a receiver for further processing. Circuitry 326 can also generate DFE $TAP_1$ through $TAP_N$ to correct or reduce inter symbol interference (ISI) between symbols included in signals IN+ and IN−.

DFE 314 can be included in a receiver (e.g., receiver 104 (FIG. 1) or receiver 204 (FIG. 2) that can receive information transmitted to the receiver using PAM signaling scheme. In some conventional types of signaling schemes (e.g., a non-return-to-zero (NRZ) signaling scheme), a single signal (e.g., signal on a single conductive trace) can carry at most one bit (e.g., only one bit) of information within a specific time interval, which is commonly called a unit interval (UI). As is known to those skilled in the art, a PAM signal can be configured to carry one bit of information within one UI or multiple bits of information within one UI. For example, a PAM-4 signal can carry two bits of information within one UI. Thus, a level (e.g., voltage level) of a PAM-4 signal within one UI can be one of the four levels corresponding to one of four possible combinations of two bits.

FIG. 3 shows an example where DFE 314 includes three comparator circuits $325_1$, $325_2$, and $325_3$ to detect four possible levels of a PAM-4 signal used in the example of FIG. 3 (e.g., signals IN+ and IN− are based on PAM-4 signaling). However, DFE 314 can include a different number of comparator circuits if a different PAM signaling is used. Thus, in the example of FIG. 3 (e.g., PAM-4 signaling), each of signals IN+ and IN− can change (e.g., swing) between different levels (e.g., different voltage values) during the operation of DFE 314, depending on the value of the information (e.g., the value of bits) carried by signals IN+ and IN−. Reference signal pairs $V_{REF1+}/V_{REF1-}$, $V_{REF2-}/V_{REF2+}$, and $V_{REF3+}/V_{REF3-}$ can have different values (e.g., predetermined values) that can be based on the range of the values of signals IN+ and IN− (e.g., based on the range of PAM-4 signaling transmitted to the receiver that includes DFE 314). During the operation of DEE 314, each of signals $V_{REF1+}$, $V_{REF1-}$, $V_{REF2+}$, $V_{REF2-}$, $V_{REF3+}$, and $V_{REF3-}$ can remain unchanged (e.g., remain constant at predetermined values) or adapted during operation.

In the example of FIG. 3 (e.g., PAM-4 signaling), comparator circuits $325_1$, $325_2$, and $325_3$ can operate to compare the values (e.g., voltage values) of input signal pair IN+ and IN− with the values (e.g., voltage values) of each of three reference signal pairs $V_{REF1+}/V_{REF1-}$, $V_{REF2+}/V_{REF2-}$, and $V_{REF3+}/V_{REF3-}$. The comparison operation allows comparator circuits $325_1$, $325_2$, and $325_3$ to detect the levels of signals IN+ and IN− (e.g., detect different eye openings in a PAM-4 signal) within each UI in order to determine the values of the two bits carried by signals IN+ and IN− within each UI.

Each of comparator circuits $325_1$, $325_2$, and $325_3$ can include a hybrid comparator that includes a combination of a pseudo-CML latch and a modified CMOS latch, as described below with reference to FIG. 4 through FIG. 5C.

Figure 4:
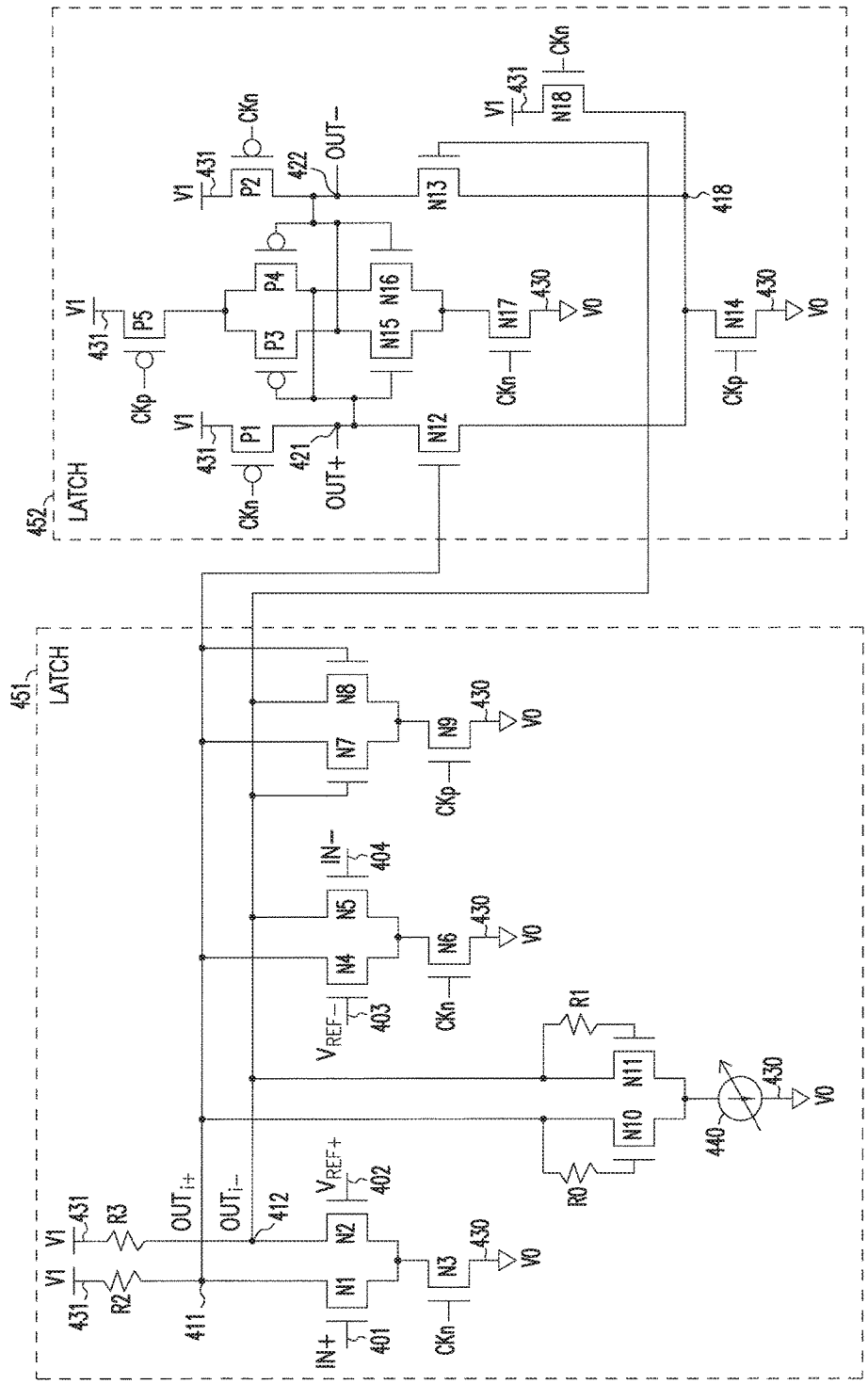
FIG. 4 shows a block diagram of a comparator circuit including combination of a pseudo-CML latch and a modified CMOS latch, according to some embodiments described herein.

FIG. 4 shows a block diagram of a comparator circuit 425 including combination of a pseudo-CML latch and a modified CMOS latch, according to some embodiments described herein. Comparator circuit 425 can be used for any of comparator circuits $325_1$, $325_2$, and $325_3$ of FIG. 3. As shown in FIG. 4, comparator circuit 425 can receive signals IN+ and IN− (e.g., input d different differential signal pair) and signals (e.g., reference signal pair) $V_{REF+}$ and $V_{REF−}$. Input differential signal pair IN+/IN− can correspond to signal pair IN+/IN− (provided by summing node 324) of FIG. 3, Reference signal pair $V_{REF+}/V_{REF−}$ can correspond to one of reference signal pairs $V_{REF1+}/V_{REF1−}$, $V_{REF2−}/V_{REF2+}$, and $V_{REF3+}/V_{REF3−}$ of FIG. 3. Comparator circuit 425 can generate (e.g., provide) signals (e.g., output signals) OUT+ and OUT−. Signals OUT+/OUT− can correspond to one of signal pairs OUT1+/OUT1−, OUT2+/OUT2−, and OUT3+/OUT3−, of FIG. 3.

As shown in FIG. 4, comparator circuit 425 can include a latch 451 and a latch 452 directly coupled to latch 451. Latch 451 is pseudo-CML latch. Latch 452 is modified CMOS latch. Latch 451 can include nodes (e.g., differential input nodes) 401 and 404 to receive signals IN+ and IN− and nodes (e.g., differential input nodes) 402 and 403 to receive signals $V_{REF+}$ and $V_{REF−}$, respectively. Latch 451 can operate to compare the values of signals IN+ and IN− with the values of signals $V_{REF+}$ and $V_{REF−}$, respectively. Latch 451 can generate signals (e.g., internal output signals) $OUT_{i+}$ and $OUT_{i−}$ at nodes 411 and 412, respectively. Nodes 411 and 412 can be output nodes of latch 451.

Latch 452 can include input nodes (e.g., differential input nodes that are coupled to nodes 411 and 412 of latch 451) to receive signals $OUT_{i+}$ and $OUT_{i−}$. Latch 452 can operate to generate signals (e.g., final output signals) OUT+ and OUT− at nodes 421 and 422 based on the values of signals (e.g., internal output signals) $OUT_{i+}$ and $OUT_{i−}$. Nodes 421 and 422 can be output nodes of latch 452. Nodes 421 and 422 can also be output nodes of comparator circuit 425. Signals OUT+ and OUT− can be output signals of latch 452. Signals OUT+ and OUT− can also be output signals of comparator circuit 425.

As shown in FIG. 4, comparator circuit 425 can include supply nodes 430 and 431. Supply node 430 can be coupled to a voltage V0 (e.g., supply voltage Vss (e.g., ground) of comparator circuit 425). Supply node 431 can be coupled to a voltage V1 (e.g., supply voltage Vcc of comparator circuit 425).

Latch 451 can include transistors NI through N11, resistors R0 through R4, and a current source 440. Current source 440 can be an adjustable (e.g., programmable) current source. Each of transistors NI through N11 can include a field effect transistor (FET), such as an n-channel metal-oxide semiconductor (NMOS) transistor.

Latch 452 can include transistors N12 through N18 and P1 through P5. Each of transistors N12 through N18 can include a field effect transistor (FET), such as an NMOS transistor. Each of transistors P1 through P5 can include an FET, such as a p-channel metal-oxide semiconductor (PMOS) transistor. Transistors N15 and P3 can be part of an inverter (e.g., CMOS inverter). Transistors N16 and P4 can be part of another inverter (e.g., CMOS inverter). The inverter (e.g., including transistors N15 and P3) and the inverter (e.g., including transistors N16 and P4) of latch 452 are clocked inverters (controlled by transistors N17 and P5) that can operate to drive signals OUT+ and OUT− to CMOS levels (e.g., rail-to-rail voltage levels corresponding to values of supply voltages Vcc and Vss).

The gates of some of the transistors (e.g., transistors N3, N6, N9, N14, N17, N18, P1, P2, and P5) of comparator circuit 425 can be controlled by either a clock signal CKn or a clock signal CKp. Based on the timing (e.g., phases) of clock signals CKn and CKp, comparator circuit 425 can operate in different modes to generate signals $OUT_{i+}$, $OUT_{i−}$, OUT+, and OUT− having values based on the values of signals IN+ and IN−.

Figure 5A:
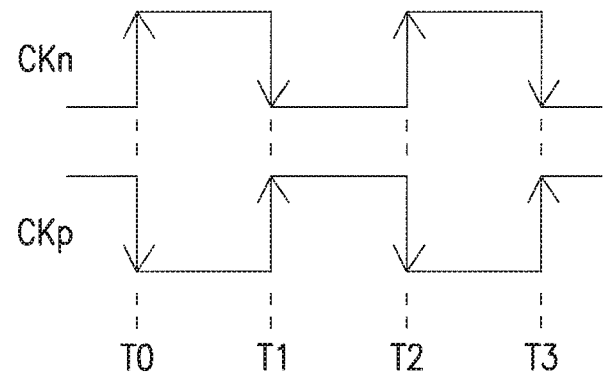
FIG. 5A is a timing diagram for clock signals of the comparator circuit of FIG. 4, according to some embodiments described herein.

FIG. 5A is a timing diagram for clock signals CKn and CKp of comparator circuit 425 of FIG. 4, according to some embodiments described herein. As shown in FIG. 5A, clock signals CKn and CKp can be complementary clock signals, such that clock signals CKn and CKp have different (e.g., opposite) phases. For example, clock signal CKn has one phase (e.g., "high") between times T0 and T1 and another phase (e.g., "low") between times T1 and T2. Clock signal CKp has one phase (e.g., "low") between times T0 and T1 and another phase (e.g., "high") between times T1 and T2.

Figure 5B:
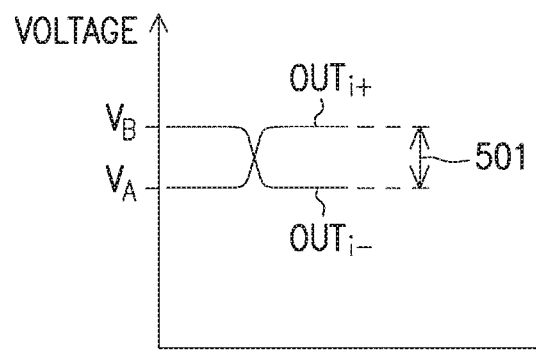
FIG. 5B is a timing diagrams for an internal output signals of a latch of the comparator circuit of FIG. 4, according to some embodiments described herein.

FIG. 5B is a timing diagram for signals (e.g., internal output signals) $OUT_{i+}$ and $OUT_{i−}$ of latch 451 of comparator circuit 425 of FIG. 4, according to some embodiments described herein. As shown in FIG. 5B, each of signals $OUT_{i−}$ and $OUT_{i−}$ can have a signal swing 501 between voltages $V_A$ and $V_B$.

Figure 5C:
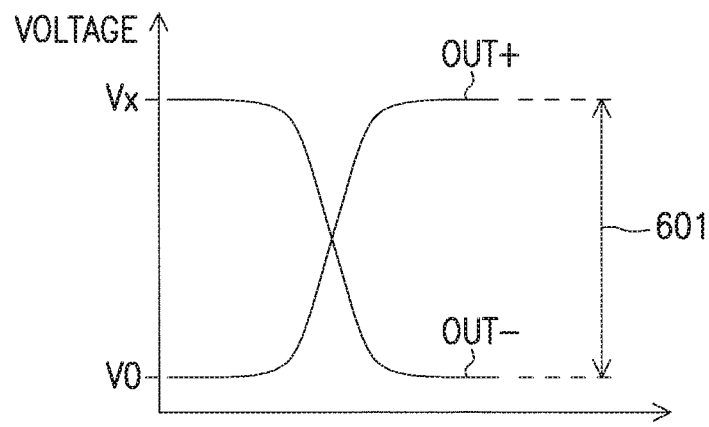
FIG. 5C is timing diagrams for final output signals of the comparator circuit of FIG. 4, according to some embodiments described herein.

FIG. 5C is a timing diagram for signals (e.g., final output signals) OUT+ and OUT− of comparator circuit 425 of FIG. 4, according to some embodiments described herein. As shown in FIG. 5C, each of signals OUT+ and OUT− can have a signal swing 601 between voltages V0 and $V_X$. Voltages V0 and $V_X$ can correspond to voltages V0 (e.g., Vss) and V1 (e.g., Vcc), respectively, of comparator circuit 425 in FIG. 4, In FIG. 5B and FIG. 5C, the difference in values between voltages $V_X$ and V0 is greater than the difference in values between voltages $V_A$ and $V_B$. Thus, signal swing 601 is greater than signal swing 501.

Referring to FIG. 4, the combination of latches 451 and 452 forms a hybrid CML-CMOS comparator. Latch 451 can operate as a pseudo CML latch and can form an input stage of comparator circuit 425. The pseudo-CML feature of latch 451 allows it to avoid headroom issues over variations in process, voltage, and temperature (PVT) that may be present in conventional CML-type latches. Latch 451 can be configured to detect different levels in a PAM signal by providing different values (e.g., providing predetermined values) for signals $V_{REF+}$ and $V_{REF−}$. This means that the detection threshold of latch 451 can be adjustable, depending on which level of the PAM signal (e.g., signals IN+ and IN−) comparator circuit 425 is configured to detect.

Transistors N10 and N11, resistors R0 and R1, and current source 440 can form an active inductor peaking structure to improve (e.g., extend) the bandwidth of latch 451, thereby increasing speed of latch 451. The active inductor peaking structure can be tunable (e.g., programmable). For example, the value of current through transistors N10 and N11 can be selected (e.g., in order to select inductance value) by adjusting (e.g., programming) the amount of current provided by current source 440.

Latch 452 can operate as a modified CMOS latch and can form an output stage of comparator circuit 425. The operation of latch 452 can include a track mode and a hold (e.g., latch) mode. The track mode allows latch 452 to track the value of signals $OUT_{i+}$ hand $OUT_{i−}$ developed by latch 451. In the hold mode, nodes 421 and 422 are disconnected (e.g., completely disconnected) from nodes 411 and 412. This allows the inverter (CMOS inverter) that includes transistors N15 and P3 and the inverter (CMOS inverter) that includes transistors N16 and P4 to drive the levels of signals OUT+ and OUT− to full CMOS levels (e.g., the levels corresponding to the values of voltages V1 (e.g., Vcc) and V0 (e.g., Vss)).

The following detailed description of the operation of comparator circuit 425 refers to FIG. 4 and FIG. 5A.

Between times T0 and T1 in FIG. 5A (e.g., when clock signal CKn is "high" and clock signal CKp is "low"), latch 451 (FIG. 4) compares the values of signals IN+ and IN− with the values of signals $V_{REF+}$ and $V_{REF-}$, respectively, as part of the operation of determining the value of data information (the values of bits) associated with a symbol included in signals IN+ and IN−. Based on the comparison, latch 451 causes a differential voltage to develop at nodes 411 and 412.

Between times T1 and T2 (e.g., when clock signal CKn is "low" and clock signal CKp is "high"), transistors N7, N8, and N9 of latch 451 operate to maintain the developed differential voltage at nodes 411 and 412.

Between times T1 and T2, latch 452 can operate in a track mode. In this mode, transistor pair N12 and N13 and transistors N14, P1, and P2 can operate to cause a differential voltage to develop at nodes 421 and 422. The differential voltage at nodes 421 and 422 between times T1 and T2 is based on the differential voltage at nodes 411 and 412.

Between times T2 and T3, the inverters of latch 452 (that include transistors N15 and P3 and transistors N16 and P4 (controlled by transistors N17 and P5)) can operate to drive signals OUT+ and OUT− to CMOS levels. For example, between times T2 and T3, latch 452 can cause one of signals OUT+ and OUT− to move toward (e.g., to reach) a voltage level (e.g., the level of voltage V1 (e.g., Vcc)) at supply node 431 and cause the other one of signals OUT+ and OUT− to move toward (e.g., to reach) a voltage level (e.g., the level of voltage V0 (e.g., Vss)) at supply node 430.

Between times T2 and T3 in FIG. 5A (e.g., when clock signal CKn is "high" and clock signal CKp is "low"), latch 451 can perform another comparison to compare the values of signals IN+ and IN− with the values of signals $V_{REF+}$ and $V_{REF-}$, respectively, to determine the value of data information associated with another symbol included in signals IN+ and IN−. The operations of comparator circuit 425 described above can repeat after time T3.

Transistor N18 can operate to further improve operation of comparator circuit 425. For example, between times T0 and T1 (e.g., when clock signal CKn is "high" and clock signal CKp is "low") and between times T2 and T3 (e.g., when clock signal Ckn is "high" and clock signal CKp is "low"), transistor N18 can operate (e.g., can turn on) to form a circuit path between supply node 431 and node 418. This causes the voltage at node 418 to reach voltage V1 (e.g., Vcc) at supply node 431 in order to prevent leakage of current (e.g., leakage through transistors N12 and N13). Preventing the leakage of current between times T0 and T1 (e.g., during hold mode of latch 452) and between times T2 and T3 (e.g., during hold mode of latch 452) can also improve the level of signals OUT+ and OUT− between time T2 and T3 (e.g., by allowing signals OUT+ and OUT− to reach full rail-to-rail voltages).

In comparison with some conventional comparator circuits, the structure and operations of comparator circuit 425 allow it to have a better input sensitivity, a wider threshold adjust, speed benefits of a CML and the output swing of a CMOS, lower power consumption, and smaller area.

FIG. 6 shows an apparatus in the form of a system (e.g., electronic system) 600, according to some embodiments described herein. System 600 can include or be included in a computer, a tablet, or other electronic systems. As shown in FIG. 6, system 600 can include a processor 605, a memory device 620, a memory controller 630, a graphics controller 640, an input and output (I/O) controller 650, a display 652, a keyboard 654, a pointing device 656, at least one antenna 658, a connector 615, and a bus 660.

Each of processor 605, memory device 620, memory controller 630, graphics controller 640, and I/O controller 650 can include an IC such as device 101 or 102 (FIG. 1).

In some arrangements, system 600 does not have to include a display. Thus, display 652 can be omitted from system 600. In some arrangements, system 600 does not have to include any antenna. Thus, antenna 658 can be omitted from system 600.

Processor 605 may include a general-purpose processor or an application-specific integrated circuit (ASIC).

Memory device 620 may include a dynamic random access memory (DRAM) device, a static random access memory (SRAM) device, a flash memory device, or a combination of these memory devices. FIG. 6 shows an example where memory device 620 is a stand-alone memory device separated from processor 605. In an alternative arrangement, memory device 620 and processor 605 can be located on the same die. In such an alternative arrangement, memory device 620 is an embedded memory in processor 605, such as embedded DRAM (eDRAM), embedded SRAM (eSRAM), embedded flash memory, or another type of embedded memory.

Display 652 can include a liquid crystal display (LCD), a touchscreen (e.g., capacitive or resistive touchscreen), or another type of display. Pointing device 656 can include a mouse, a stylus, or another type of pointing device.

I/O controller 650 can include a communication module for wired or wireless communication (e.g., communication through one or more antenna 658). Such wireless communication may include communication in accordance with WiFi communication technique, Long Term Evolution Advanced (LTE-A) communication technique, or other communication techniques.

I/O controller 650 can also include a module to allow system 600 to communicate with other devices or systems in accordance with one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 615 can be arranged (e.g., can include terminals, such as pins) to allow system 600 to be coupled to an external device (or system). This may allow system 600 to communicate (e.g., exchange information) with such a device (or system) through connector 615. Connector 615 may be coupled to I/O controller 650 through a connection 616 (e.g., a bus).

Connector 615, connection 616, and at least a portion of bus 660 can include conductive lines that conform with at least one of USB, DP, HDMI, Thunderbolt, PCIe, Ethernet, and other specifications.

I/O controller 650 can include a transceiver (Tx/Rx) 670a having a receiver (Rx) 672 and a transmitter (Tx) 674. Transmitter 674 can operate to transmit information from I/O controller 650 to another part of system 600 or to an external device (or system) coupled to connector 615. Receiver 672 can operate to allow I/O controller 650 to receive information from another part of system 600 or from an external device (or system) coupled to connector 615. Receiver 672 can include any of the receivers described above with reference to FIG. 1 through FIG. 5C.

As shown in FIG. 6, processor 605, memory device 620, memory controller 630, and graphics controller 640 can include transceivers 670b, 670c, 670d, and 670e, respectively, to allow each of these components to transmit and receive information through their respective transceiver. At least one of transceivers 670b, 670c, 670d, and 670e can be similar to or identical to transceiver 670a. Thus, at least one of transceivers 670b, 670c, 670d, and 670e can include a receiver similar to or identical to receiver 672. For example, at least one of transceivers 670b, 670c, 670d, and 670e can include a receiver that can be arranged to allow at least one of processor 605, memory device 620, memory controller 630, and graphics controller 640 to receive information (e.g., signals) from another part of system 600 or from an external device (or system) coupled to connector 615.

FIG. 6 shows the components of system 600 arranged separately from each other as an example. For example, each of processor 605, memory device 620, memory controller 630, graphics controller 640, and I/O controller 650 can be located on a separate die (e.g., semiconductor die or an IC chip). In some arrangements, two or more components (e.g., processor 605, memory device 620, graphics controller 640, and I/O controller 650) of system 600 can be located on the same die (e.g., same IC chip) that forms a system-on-chip (SoC).

Figure 7:
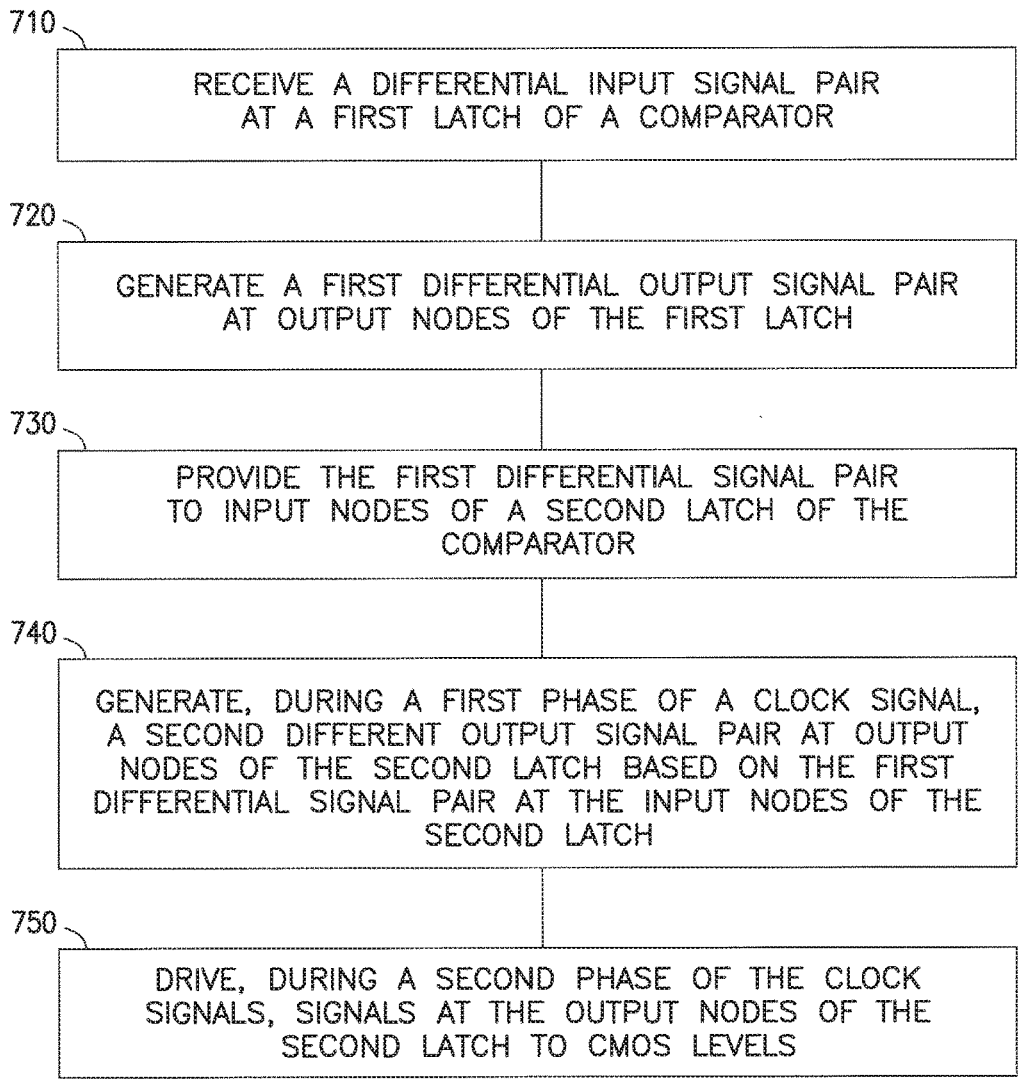
FIG. 7 is a flowchart showing a method of operating a receiver, according to some embodiments described herein.

FIG. 7 is a flowchart showing a method 700 of operating a receiver, according to some embodiments described herein. The receiver used in method 700 can include any of the receivers described above with reference to FIG. 1 through FIG. 6. Some of the activities in method 700 may be performed by hardware, software, firmware, or any combination of hardware, software, and firmware. Such hardware, software, and firmware can be included in the receiver or the device or system that includes the receiver.

As shown in FIG. 7, activity 710 of method 700 can include receiving a differential input signal pair at a first latch of a comparator. Activity 720 can include generating a first differential output signal pair at output nodes of the first latch. Activity 730 can include providing the first differential signal pair to input nodes of a second latch of the comparator. Activity 740 can include generating, during a first phase of a clock signal, a second differential output signal pair at output nodes of the second latch based on the first differential signal pair at the input nodes of the second latch. Activity 750 can include driving, during a second phase of the clock signals, signals at the output nodes of the second latch to CMOS levels.

Method 700 can include fewer or more activities relative to activities 710, 720, 730, 740, and 750 shown in FIG. 7. For example, method 700 can include activities and operations of receivers including DFEs described above with reference to FIG. 1 through FIG. 6.

The illustrations of the apparatuses (e.g., apparatus 100 including receivers 104, and 204, DFE 314, comparator circuit 425, and system 600) and methods (e.g., method 700 and operations of receivers 104, and 204, DFE 314, comparator circuit 425, and system 600) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including a first latch to receive an input signal at a gate of a transistor of the first latch and compare the input signal with a reference signal to provide a first output signal at an output node of the first latch, and a second latch coupled to the output node of the first latch, the second latch including a complementary-metal-oxide semiconductor (CMOS) inverter to generate a second output signal at an output node of the second latch based on the first output signal, the second output signal having a signal swing greater than a signal swing of the first output signal.

In Example 2, the subject matter of Example 1 may optionally include, wherein the first latch includes a tunable inductor coupled to the output node of the first latch.

In Example 3, the subject matter of Example 1 or 2 may optionally include, wherein the output node of the second latch is a first output node of the second latch, and the second latch further includes a second output node, and the second latch is configured to operate in a first mode to cause a differential voltage to develop at the first and second output nodes of the second latch, and to operate in a second mode to cause a level of the second output signal to move toward a voltage level at a first supply node and to cause a level of a signal at the second output node to move toward a voltage level of a second supply node.

In Example 4, the subject matter of Example 3 may optionally include, wherein each of the first and second latches include transistors having gates to receive a clock signal, wherein the second latch is configured to operate in the first mode during a first phase of the clock signal and to operate in the second mode during a second phase of the clock signal.

In Example 5, the subject matter of Example 3 may optionally include, wherein the second latch includes a pair of transistors having drains coupled to the first and second output nodes to form a differential transistor pair to cause the differential voltage to develop at the first and second output nodes of the second latch, and the inverter includes an input node and an output node, the input node of the inverter coupled to the first output node of the second latch, and the output node of the inverter coupled to the second output node of the second latch.

In Example 6, the subject matter of Example 5 may optionally include, wherein the second latch includes a first additional transistor coupled between sources of the pair of transistors and a first supply node, and a second additional transistor coupled between the sources of the pair of transistors and a second supply node.

In Example 7, the subject matter of Example 1 or 2 may optionally include, wherein the output node of the first latch is part of first and second differential input nodes, the first latch includes a first differential pair of transistors having drains coupled to the first and second differential input nodes, and the second latch includes a second different pair of transistors having gates coupled to the first and second differential input nodes.

In Example 8, the subject matter of Example 1 or 2 may optionally include, wherein the input signal is a pulse-amplitude modulated signal.

In Example 9, the subject matter of Example 1 or 2 may optionally include, wherein the first latch is based on a current-mode-logic (CML)-type latch, and the second latch is based on a CMOS-type latch.

Example 10 includes subject matter (such as a device, an electronic apparatus (e.g., circuit, electronic system, or both), or a machine) including a first latch including a first pair of transistors including gates coupled to first and second input nodes and drains coupled to first and second output nodes, and a second pair of transistors including gates coupled to third and fourth input nodes and drains coupled to the first and second output nodes, and a second latch including a third pair of transistors including gates coupled to the first and second output nodes, and a drain coupled to third and fourth output nodes, a first inverter including an input node coupled to the third output node, and an output node coupled to the fourth output node, and a second inverter including an input node coupled to the fourth output node, and an output node coupled to the third output node.

In Example 11, the subject matter of Example 10 may optionally include, wherein the first latch further includes a first transistor coupled between a node and the first output node, a second transistor coupled between the node and the second output node, a first resistor coupled between the first output node and a gate of the first transistor, a second resistor coupled between the second output node and a gate of the second transistor, and a current source coupled between the node and a supply node.

In Example 12, the subject matter of Example 10 may optionally include, wherein the first latch further includes a first transistor coupled between a node and the first output node, the first transistor including a gate coupled to the second output node, a second transistor coupled between the node and the first output node, the second transistor including a gate coupled to the first output node, and a third transistor coupled between the node and a supply node.

In Example 13, the subject matter of Example 10 may optionally include, wherein the second latch further includes a first additional transistor coupled between sources of the third pair of transistors and a first supply node, and a second additional transistor coupled between the sources of the third pair of transistors and a second supply node, a third additional transistor coupled between the first and second inverter and the first supply node, and a fourth transistor coupled between the first and second inverter and the second supply node.

Example 14 includes subject matter (such as a device, an electronic apparatus (e.g., circuit, electronic system, or both), or a machine) including first and second input nodes to receive differential input signals, a first comparator circuit to compare the differential input signals with first reference signals, a second comparator circuit to compare the differential input signals with second reference signals, and a third comparator circuit to compare the differential input signals with third reference signals, each of the first, second, and third comparators including a first latch to generate a differential signal at output nodes of the first latch based on values of the differential input signals and values of respective reference signals among first, second, and third reference signals, and a second latch to develop a differential signal at output nodes of the second latch during a first phase of a clock signal based on differential voltage at the output nodes of the first latch, the second latch including a pair of clocked inverters to generate complementary-metal-oxide semiconductor (CMOS) output signals based on the differential signal at the output nodes of the second latch during a second phase of the clock signal.

In Example 15, the subject matter of Example 14 may optionally include, wherein the first latch includes an adjustable current source coupled between the output nodes of the first latch and a supply node.

In Example 16, the subject matter of Example 14 or 15 may optionally include, wherein the first, second, and third reference signals have different values.

Example 17 includes subject matter (such as a device, an electronic apparatus (e.g., circuit, electronic system, or both), or a machine) including conductive lines on a circuit board, a first device coupled to the conductive lines, and a second device coupled to the conductive lines, the second device including a decision feedback equalizer (DFE), the DFE including a comparator circuit, the comparator circuit including a first latch to receive an input signal at a gate of a transistor of the first latch and compare the input signal with a reference signal to provide a first output signal at an output node of the first latch, and a second latch coupled to the output node of the first latch, the second latch including a complementary-metal-oxide semiconductor (CMOS) inverter to generate a second output signal at an output node of the second latch based on the first output signal, the second output signal having a signal swing greater than a signal swing of the first output signal.

In Example 18, the subject matter of Example 17 may optionally include, wherein the second device further includes a continuous time linear equalizer coupled to the DFE.

In Example 19, the subject matter of Example 17 or 18 may optionally include, wherein the conductive lines conform with at least one of Universal Serial Bus (USB), DisplayPort (DP), High-Definition Multimedia Interface (HDMI), Thunderbolt, Ethernet, and Peripheral Component Interconnect Express (PCIe) specifications.

In Example 20, the subject matter of Example 17 may optionally include, wherein the input signal is a pulse-amplitude modulated signal.

Example 21 includes subject matter (such as a method of operating a device, an electronic apparatus (e.g., circuit, electronic system, or both), or a machine) including receiving a differential input signal pair at a first latch of a comparator circuit, generating a first differential output signal pair at output nodes of the first latch, providing the first differential output signal pair to input nodes of a second latch of the comparator, generating, during a first phase of a clock signal, a second differential output signal pair at output nodes of the second latch based on the first differential output signal pair at the input nodes of the second latch, and driving, during a second phase of the clock signal, signals at the output nodes of the second latch to complementary-metal-oxide semiconductor (CMOS) levels.

In Example 22, the subject matter of Example 21 may optionally include, wherein further comprising developing a third differential signal at the inputs of the second latch.

In Example 23, the subject matter of Example 21 may optionally include, wherein the differential input signal pair includes pulse-amplitude signals.

In Example 24, the subject matter of Example 21 may optionally include, wherein further comprising providing the differential input signal pair from a summing node of an equalizer to the comparator circuit.

In Example 25, the subject matter of Example 24 may optionally include, wherein the summing node and the comparator circuit are parts of the equalizer, and the equalizer includes a decision feedback equalizer (DFE).

Example 26 includes subject matter (such as a device, an electronic apparatus (e.g., circuit, electronic system, or both), or machine) including means for performing any of the methods of Examples 21-25.

The subject matter of Example 1 through Example 26 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a first latch to receive an input signal at a gate of a transistor of the first latch and compare the input signal with a reference signal to provide a first output signal at an output node of the first latch;
   a second latch coupled to the output node of the first latch, the second latch including a complementary-metal-oxide semiconductor (CMOS) inverter to generate a second output signal at an output node of the second latch based on the first output signal, the second output signal having a signal swing greater than a signal swing of the first output signal;
   the output node of the second latch is a first output node of the second latch, and the second latch further includes a second output node, and the second latch is configured to operate in a first mode to cause a differential voltage to develop at the first and second output nodes of the second latch, and to operate in a second mode to cause a level of the second output signal to move toward a voltage level at a first supply node and to cause a level of a signal at the second output node to move toward a voltage level of a second supply node;
   the second latch includes a pair of transistors having drains coupled to the first and second output nodes to form a differential transistor pair to cause the differential voltage to develop at the first and second output nodes of the second latch, and the inverter includes an input node and an output node, the input node of the inverter coupled to the first output node of the second latch, and the output node of the inverter coupled to the second output node of the second latch; and
   the second latch includes a first additional transistor coupled between sources of the pair of transistors and a first supply node, and a second additional transistor coupled between the sources of the pair of transistors and a second supply node.

2. The apparatus of claim 1, wherein each of the first and second latches include transistors having gates to receive a clock signal, wherein the second latch is configured to operate in the first mode during a first phase of the clock signal and to operate in the second mode during a second phase of the clock signal.

3. The apparatus of claim 1, wherein the output node of the first latch is part of first and second differential input nodes, the first latch includes a first differential pair of transistors having drains coupled to the first and second differential input nodes.

4. The apparatus of claim 1, wherein the input signal is a pulse-amplitude modulated signal.

5. The apparatus of claim 1, wherein the first latch is based on a current-mode-logic (CML)-type latch, and the second latch is based on a CMOS-type latch.

6. An apparatus comprising:
   a first latch including:
   a first pair of transistors including gates coupled to first and second input nodes and drains coupled to first and second output nodes; and
   a second pair of transistors including gates coupled to third and fourth input nodes and drains coupled to the first and second output nodes; and
   a second latch including:
   a third pair of transistors including gates coupled to the first and second output nodes, and drains coupled to third and fourth output nodes;
   a first inverter including an input node coupled to the third output node, and an output node coupled to the fourth output node
   a second inverter including an input node coupled to the fourth output node, and an output node coupled to the third output node;
   a first additional transistor coupled between sources of the third pair of transistors and a first supply node, and a second additional transistor coupled between the sources of the third pair of transistors and a second supply node;
   a third additional transistor coupled between the first and second inverters and the first supply node; and
   a fourth transistor coupled between the first and second inverters and the second supply node.

7. The apparatus of claim 6, wherein the first latch further includes:
   a first transistor coupled between a node and the first output node, the first transistor including a gate coupled to the second output node;
   a second transistor coupled between the node and the first output node, the second transistor including a gate coupled to the first output node; and
   a third transistor coupled between the node and a supply node.

8. The apparatus of claim 6, wherein the first latch includes an adjustable current source coupled between the output nodes of the first latch and a supply node.

9. The apparatus of claim 6 further comprising:
   conductive lines on a circuit board;
   a first device coupled to the conductive lines; and
   a second device coupled to the conductive lines, the second device including a decision feedback equalizer (DFE), the DFE including a comparator circuit, the comparator circuit including the first latch and the second latch.

10. The apparatus of claim 9, wherein the second device further includes a continuous time linear equalizer coupled to the DFE.

11. The apparatus of claim 9, wherein the conductive lines conform with at least one of Universal Serial Bus (USB), DisplayPort (DP), High-Definition Multimedia Interface (HDMI), Thunderbolt, Ethernet, and Peripheral Component Interconnect Express (PCIe) specifications.

12. The apparatus of claim 9, wherein the input signal is a pulse-amplitude modulated signal.

\* \* \* \* \*